United States Patent [19]

Honda

[11] 4,169,516

[45] Oct. 2, 1979

[54] SPEAKER SYSTEM

[76] Inventor: Ichiro Honda, No. 3-2-25, Ohgigaya, Kamakura, Kanagawa-Ken, Japan

[21] Appl. No.: 790,695

[22] Filed: Apr. 25, 1977

[30] Foreign Application Priority Data

| | | | |
|---|---|---|---|
| Apr. 26, 1976 | [JP] | Japan | 51-51306 |
| Apr. 26, 1976 | [JP] | Japan | 51-51307 |
| Apr. 26, 1976 | [JP] | Japan | 51-51308 |
| Jun. 15, 1976 | [JP] | Japan | 51-77055 |

[51] Int. Cl.[2] .................... H05K 5/00

[52] U.S. Cl. .................... 181/153; 181/199; 181/152; 181/150

[58] Field of Search .................... 181/143, 148, 150, 153, 181/155, 156, 160, 163, 198, 199

[56] References Cited

U.S. PATENT DOCUMENTS

| | | | |
|---|---|---|---|
| 2,872,516 | 2/1959 | Hoffman | 181/144 |
| 2,973,824 | 3/1961 | Pinski | 181/144 |
| 3,135,348 | 6/1964 | Bill | 181/147 |
| 3,941,207 | 3/1976 | Croup | 181/199 |
| 4,057,689 | 11/1977 | Stallings, Jr. | 181/145 |

*Primary Examiner*—L. T. Hix
*Assistant Examiner*—Benjamin R. Fuller
*Attorney, Agent, or Firm*—Haseltine, Lake & Waters

[57] ABSTRACT

A speaker system comprises a cylindrical enclosure and at least one speaker attached to the cylindrical side wall of the enclosure. The speaker is attached to the side wall of the enclosure in such a state that the front thereof is supported at a position depressed from the side surface of the enclosure by a baffle plate or that it is inserted through an opening formed on the side wall and supported by a support member.

1 Claim, 12 Drawing Figures

FIG. 1
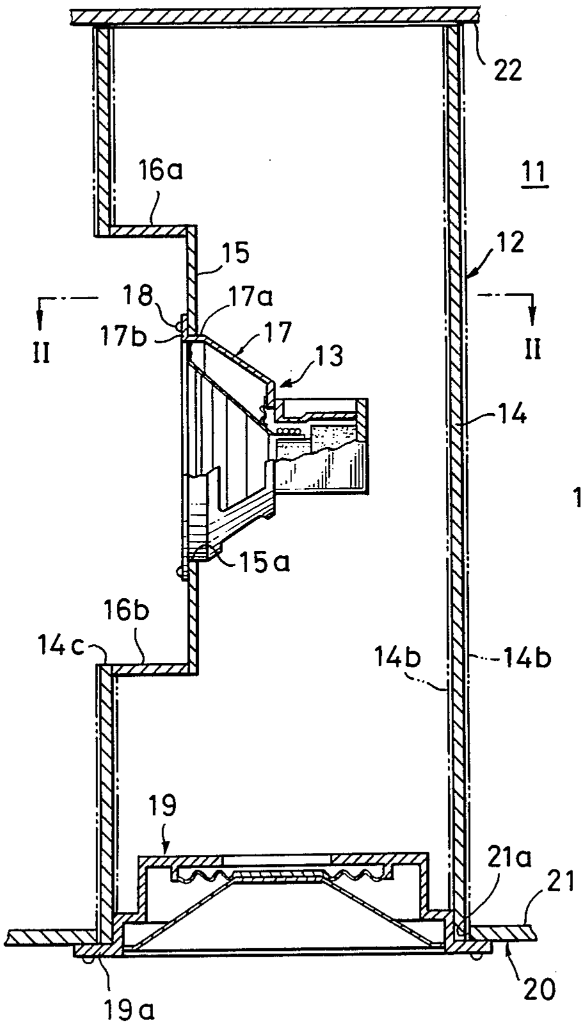
FIG. 2
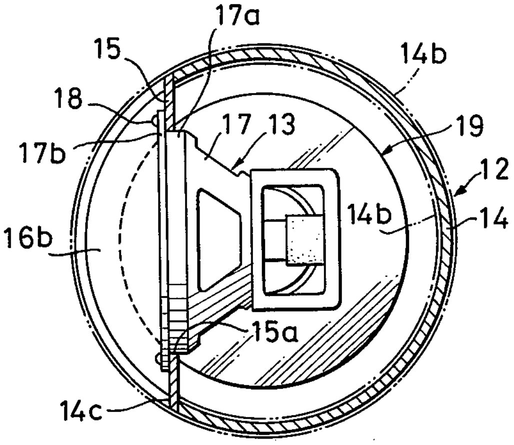
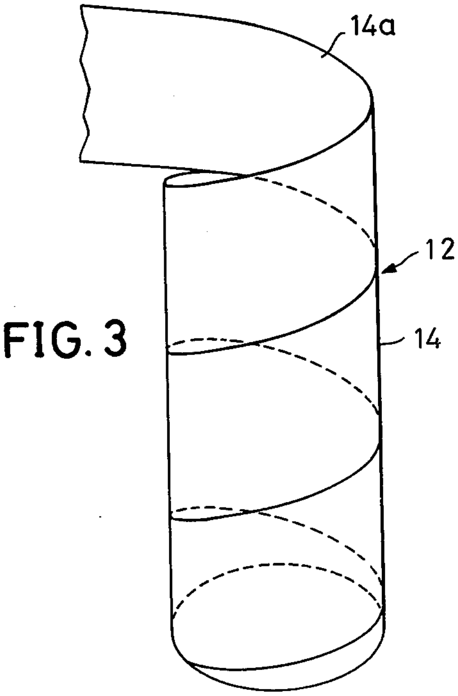
FIG. 3

SPEAKER SYSTEM

BACKGROUND OF THE INVENTION

The present invention generally relates to speaker systems and more particularly to a speaker system wherein a speaker is attached to a cylindrical enclosure at a predetermined position on the cylindrical side wall thereof.

Speaker systems having a cylindrical enclosure known heretofore have been constructed by disposing a speaker at the top or bottom of the cylindrical enclosure facing upward or downward, and further by providing a cone-formed diffuser so that it confronts the front of the speaker to distribute or diffuse the sound radiated from the speaker upward or downward to the side or horizontal direction. In the conventional speaker system of this type, the speakers are located at the top or the bottom of the enclosure. This conventional speaker system is therefore accompanied by difficulties where the magnitude of the sound pressure imparted to the enclosure has extreme differences between the upper and lower parts of the enclosure, whereby the preferred sound is not radiated.

SUMMARY OF THE INVENTION

Accordingly, it is a general object of the present invention to provide a novel and useful speaker system which overcomes the above described difficulties.

Another object of the present invention is to provide a speaker system in which a speaker is attached to the side wall of a cylindrical enclosure through an opening formed thereat. In the speaker system according to the present invention, the sound pressure is uniformly imparted to the whole area of the inner side of the enclosure, whereby a preferred sound radiation is accomplished.

Another object of the present invention is to provide a speaker system in which a paper pipe, which is formed by spirally winding a card board in a cylindrical shape, is employed for the above described cylindrical enclosure. The speaker system of the present invention as manufactured is less expensive.

Still another object of the present invention is to provide a speaker system in which a folded horn may be easily formed between the outer peripheral surface of the cylindrical enclosure and the inner surface of an external casing accommodating the enclosure therein. The speaker system of this arrangement preferably radiates sound of the lower frequency range.

Other objects and further features of the present invention will be apparent from the following detailed description set forth in conjunction with the accompanying drawings.

BRIEF DESCRIPTION OF THE DRAWINGS

In the drawings:

FIG. 1 is an elevation, in vertical section, showing a first embodiment of a speaker system according to the present invention;

FIG. 2 is a plan view in transverse section taken along the line II—II in FIG. 1 and viewed in the arrow direction;

FIG. 3 is a perspective view showing a cylindrical enclosure of the speaker system in FIG. 1;

DETAILED DESCRIPTION

Figure 4:
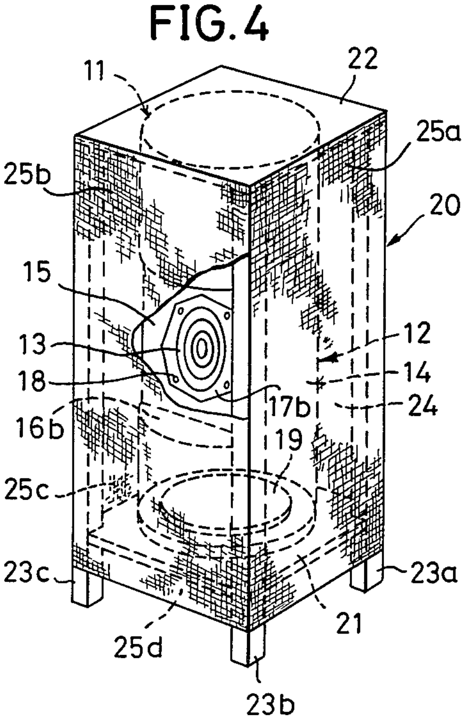
FIG. 4 is a perspective view showing a state where the speaker system in FIG. 1 is accommodated within a speaker accommodation box or outer casing.

Referring to FIG. 1 and FIG. 2, a speaker system 11 is substantially constructed with a cylindrical enclosure 12 and a speaker 13.

The enclosure 12 consists of a so-called paper pipe cut in a predetermined length and having a cylindrical side wall 14. The paper pipe is formed, as illustrated in FIG. 3, by winding a card board 14*a* having a predetermined spiral thickness and by gluing or cementing the overlapped edge thereof. The cylindrical side wall 14 is coated with a paint layer 14*b*, as indicated by a two-dotted chain line in FIGS. 1 and 2. The paint layer 14*b* is formed by coating paints such as varnish over a whole surface including the external and internal surfaces thereof. A window opening 14*c* is formed on the side wall 14 at a substantially intermediate height position thereof. A buffle plate 15 is of a quadrangle flat plate made of plastic, and has a circular opening 15*a* formed at a center part thereof. This buffle plate 15 is attached to the opening 14*c* in such a manner that the upper and lower parts thereof are supported by crescent shaped plates 16*a* and 16*b*, and either sides thereof are fixed directly to the side wall 14.

A speaker 13 is attached to the buffle plate 15 by being fixed an outer peripheral part 17*b* of a housing 17 with screws 18 in a state where the speaker 17 is wholly accommodated within the enclosure 12. Accordingly, the front surface of the speaker 13 is positioned at a position defined by a predetermined distance from the outer peripheral surface of the side wall 14. A drone cone 19 is disposed at the bottom opening of the enclosure 12, and is attached by fixing an outer peripheral part 19*a* to an opening 21*a* formed on a base plate 21 of an accommodation box 20 described hereinafter. Accordingly, when the speaker system 11 is accommodated within the accommodation box 20, the speaker system 11 is supported by the outer peripheral part 19*a* of the drone cone 19, as illustrated in FIG. 1. The top opening of the enclosure 12 is covered by a top plate 22 of the accommodation box 20.

Thus, in the speaker system 11 having a construction described hereinbefore, the speaker 13 is disposed at an intermediate height position of the cylindrical speaker enclosure 12. Accordingly, when the speaker 13 radiates sound, pressure of the sound is imparted to the top and bottom parts of the enclosure 12 in substantially same level, whereby the above described sound pressure acts equally over the substantially whole area inside of the enclosure 12.

Moreover, since the cylindrical side wall 14 of the enclosure 12 is made of card board, the sound radiated from the speaker 13 is absorbed appropriately by the side wall 14, whereby the necessity for providing a large amount of sound absorbing material is now obviated. Furthermore, since the cylindrical side wall 14 winding formed by spirally the card board it forms a construction which is uneven in the longitudinal direction and lateral direction. The sounds reflected by the inner surface of the side wall 14 are cancelled with each other in all directions, whereby occurrance of resonance is therefore prevented. Noises in the radiated sound are reflected by the paint layer **14*b* and are confined in the enclosure 12 and do not radiate outside. Therefore, in accordance with and speaker apparatus 11** constructed as described hereinbefore, extremely preferred sound can be obtained.

The accommodation box 20 is constructed, as illustrated in FIG. 4, by fixing the base plate 21 and the top plate 22 to four poles **23*a* through 23*d* (the pole 23*d* is not shown). Further, the rear side of the accommodation box 20 is covered with a plate 24, while the other three sides thereof are covered with textile fabric 25*a* through 25*c***.

When the speaker system 11 is accommodated within the accommodation box 20, the speaker system 11 is inserted or loaded into the box 20 from the lower side of the base plate 21 through the opening **21*a* and then, a drone corn 19 is attached to the base plate 21 as illustrated in FIG. 1. The textile fabric 25*d* is stretched at the lower side of the drone corn 19**.

Next, a second embodiment of the speaker system according to the present invention will be described in conjunction with FIG. 5 and FIG. 6. In both figures, parts which are the same as those in FIGS. 1 and 2 are designated by the like reference numerals and the description thereof is not repeated.

In a speaker system 31, a support member 32 to which the speaker 13 is attached is fixed to the side wall 14 of the enclosure 12 through an opening **14*d* formed thereat. The front surface of the speaker 13 is substantially in the same plane as the tangential plane of the outer peripheral surface of the side wall 14 or projects slightly from the side wall 14. The assembling manner for accommodating the speaker system 31 in the accommodation box 20 is exactly the same as that of the above described speaker system 11**.

However, the present invention is not restricted to the above described embodiments having the single speaker 13, but other modifications in which a plurality number of speakers are arranged in logitudinal direction of the enclosure may be employed.

Moreover, in the embodiments described above, the speaker systems 11 and 31 are provided with the drone corn 19, but the drone corn 19 may be omitted. Further, by forming an opening having a predetermined configuration at a predetermined position on the cylindrical side wall 14, the enclosure 12 performs as a bass-reflex enclosure.

In the above described embodiment, the enclosure 12 itself has the sound absorbing properties because the enclosure 12 is made of card board. However, the absorbing material such as glass-wool may be filled within the enclosure 12 for enhancing the sound absorbing effect.

Figure 10:
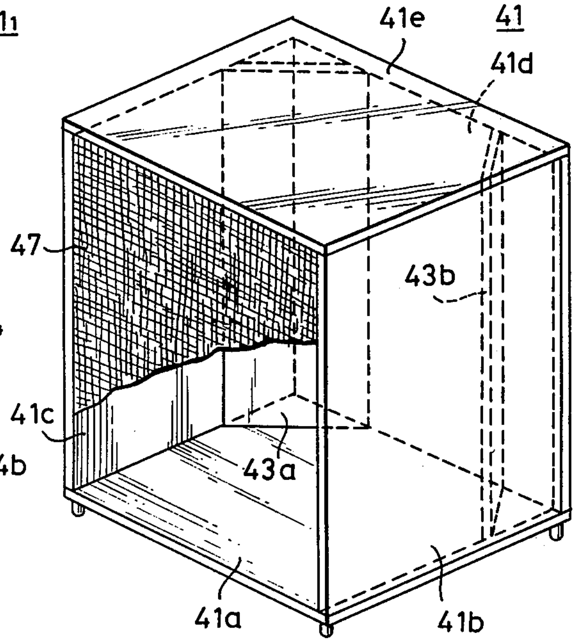
FIG. 10 is a perspective view showing a speaker accommodation box which can be used in the speaker system illustrated in FIG. 7 and FIG. 8.

Next, a third embodiment of a speaker system according to the present invention will be described with reference to FIG. 7. A speaker apparatus structure $11_1$ has a construction in which the enclosure 12 has a window opening **14*e* formed on the side wall 14 thereof, and a flange 42 is fitted to the bottom part of the side wall 14. The drone cone 19 and the opening 14*c* are omitted. The window opening 14*e* has a size smaller than the window opening 14*c*. An outer casing 41 has the shape of a box formed of side plates 41*b*, 41*c*, and 41*d*, a base plate 41*a*, and a top plate 41*e*, as illustrated in FIG. 10. Guide plates 43*a* and 43*b* are respectively provided at two corners formed by the side plates 41*b*, 41*c*, and 41*d*. Over the front side of the outer casing 41, a fabric net 44** is held in tension.

Figure 7:
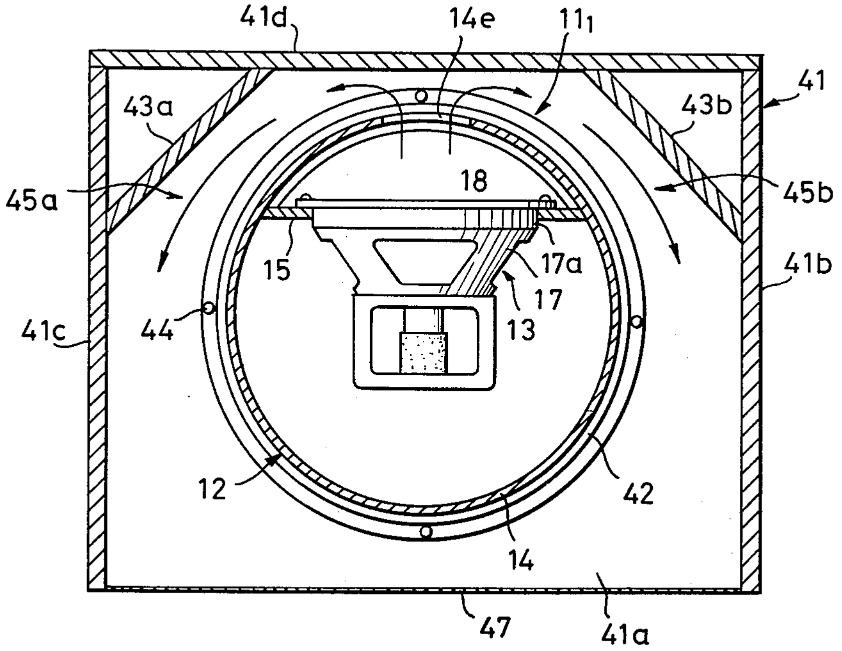
FIG. 7 is a transverse section showing a third embodiment of the speaker system of the present invention.

In FIG. 7, the speaker system structure $11_1$ is mounted on the base plate **41*a* of the outer casing 41 at a center part thereof by screws 44, and the window opening 14*e* on the side wall 14 confronts the rear side plate 41*d* at a position in the vicinity thereof. Thus, folded horn parts 45*a* and 45*b*, which are symmetric with each other and have increasing sectional areas toward the front, are formed or defined between the inner surface of the outer casing 41 including the guide plates 43*a* and 43*b* and the outer peripheral surface of the side wall part 14. The sound radiated from the speaker 13 is throttled at the window opening 14*e* thereby causing the sound pressure to increase, and thereafter, as indicated by the arrow in the same figure, is reflected by the rear side plate 41*d* thereby being separated to the right and left, and further advances forward and is guided by the folded horn parts 45*a* and 45*b*. The preferred reproduced sound can be obtained having a preferred characteristic in the lower frequency range due to the effect of the holded horn parts 45*a* and 45*b*. Moreover, since at least the outer peripheral surface of the side wall 14 is a curved surface, the above described folded horn parts 45*a* and 45*b*** resemble a more preferable horn configuration, whereby the preferred reproduced sound can be obtained.

Figure 8:
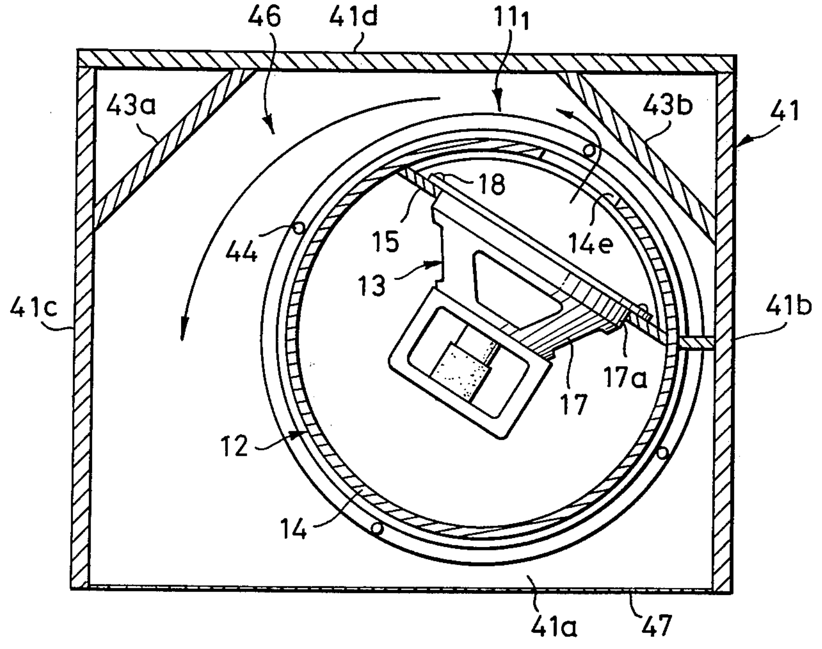
FIG. 8 is a transverse section showing a modification of the speaker system illustrated in FIG. 7.
Figure 9:
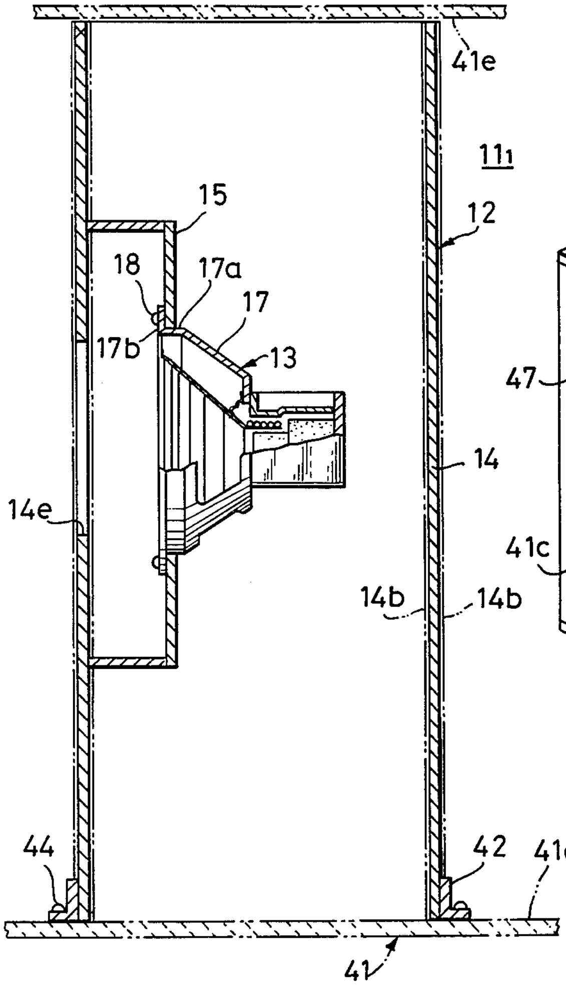
FIG. 9 is a vertical section showing a speaker system structure which can be used in the speaker system indicated in FIG. 7 and FIG. 8.

FIG. 8 shows a modification of the speaker system indicated in FIG. 7. The speaker system $11_1$ is disposed at a position deviated to the right in the outer casing 41, whereby the window opening **14*e* confronts the guide plate 43*b* at a position in the vicinity thereof. Thus, a single folded horn part 46 is formed or defined between the inner surface of the outer casing 41 and the outer peripheral surface of the side wall 14. The sound radiated from the speaker 13 is throttled at the window opening 14*e*, and the sound thus having a relatively high sound pressure is reflected by the guide plate 43*b*. The sound reflected by the guide plate 43*b* advances toward left and further advances forward and is guided by the folded horn part 46, as indicated by the arrows in FIG. 8**. Accordingly, the preferred reproduced sound can be obtained, similarly as in the preceding case.

Figure 11:
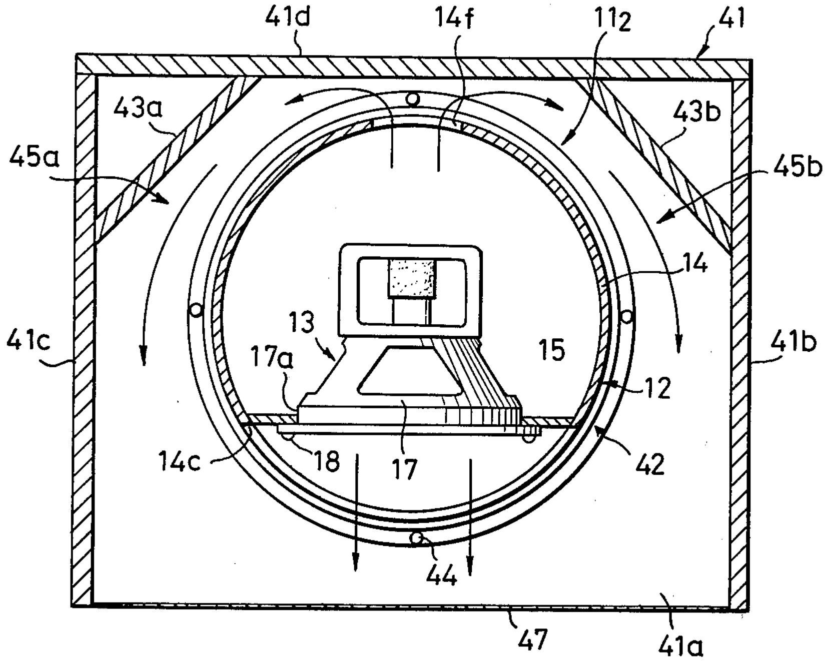
FIG. 11 is a transverse section showing a fourth embodiment of the speaker system of the present invention.

FIG. 11 shows a fourth embodiment of the speaker system of the present invention. A speaker system structure $11_2$ has a construction in which a window opening **14*f* is formed on the side wall 14 of the speaker system 11 of the first embodiment at the rear part of the speaker 13, the drone corn 19 is removed, and the flange 42 is attached to the enclosure 12. The speaker system $11_2$ of the above described construction is disposed at a center substantially within the outer casing 41, so that the speaker 13 faces forward and the window opening 14*f*** confronts the rear side plate 41*d* at a position in the vicinity thereof, thereby forming the folded horn parts 45*a* and 45*b* in the same manner as in the embodiment illustrated in FIG. 7.

In this arrangement, the sound of middle and higher frequency ranges is directly radiated forward from the front of the speaker 13. While, the sound in the lower frequency range radiated backward from the rear of the speaker 13 is throttled at the window opening 14*f* thereby causing the sound pressure to increase, and thereafter, advances forward and is guided by the folded horn parts 45*a* and 45*b*. Thus, a preferred sound in the lower frequency range can be obtained, similarly as in the preceding embodiment.

Figure 12:
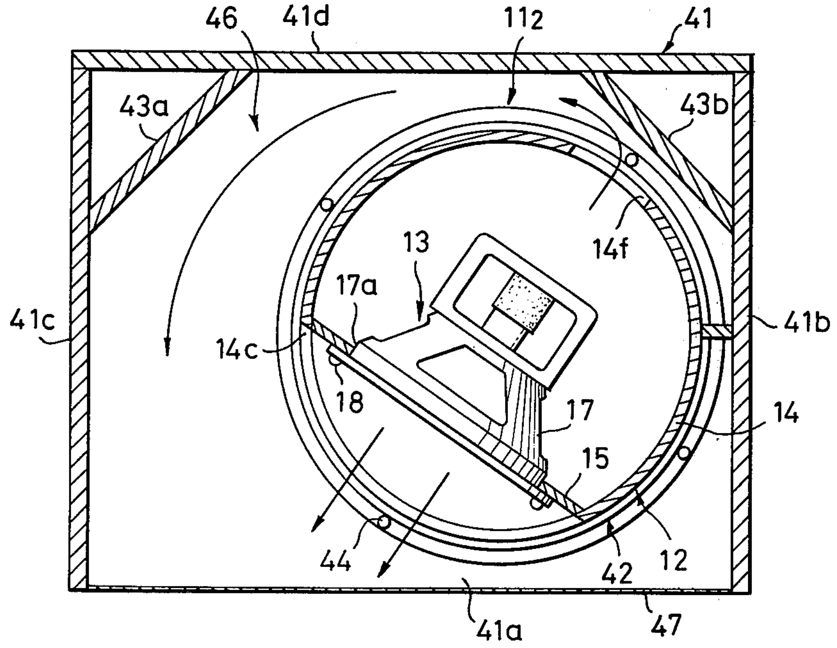
FIG. 12 is a transverse section showing a modification of the speaker system illustrated in FIG. 10.

FIG. 12 shows a modification of the embodiment illustrated in FIG. 11. The speaker system structure $\mathbf{11_2}$ is disposed at a substantially right side within the outer casing 41, so that the speaker 13 faces toward left-front direction and the window opening 14*f* confronts the guide plate 43*b* in the vicinity thereof, thereby forming or defining the folded horn part 46, similarly as in the embodiment in FIG. 8. Accordingly, the sound in the middle and higher frequency ranges is preferably radiated to the left-front direction from the front of the speaker 13, whereas the sound in the lower frequency range is preferably radiated backward and then advances forward and is guided by the folded horn part 46.

Figure 5:
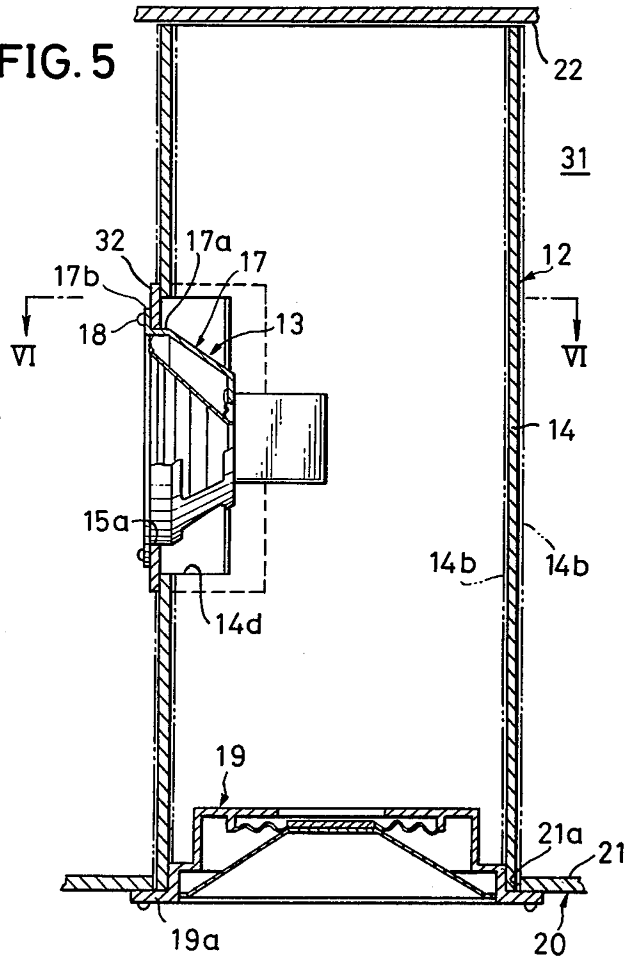
FIG. 5 is a vertical section showing a second embodiment of the speaker system according to the present invention.
Figure 6:
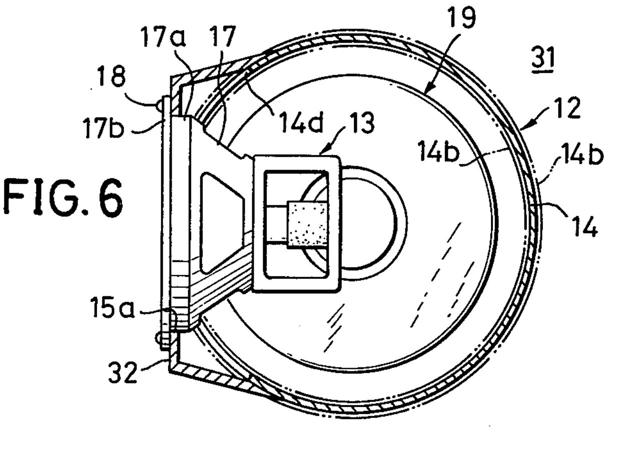
FIG. 6 is a transverse section taken along the line VI—VI in FIG. 5.

Here, the speaker system structures $\mathbf{11_1}$ and $\mathbf{11_2}$ in respective embodiments and modifications thereof illustrated in FIG. 7 through FIG. 12 have the structures obtained by modifying the speaker system of the first embodiment but the modified structure based on the system of the second embodiment illustrated in FIGS. 5 and 6 may be adopted.

Moreover, the window openings 14*e* and 14*f* of the speaker systems $\mathbf{11_1}$, $\mathbf{11_2}$, and 31 are respectively of quadrangle extending lengthwise in the above described embodiments. However, the configuration of the opening is not limited to this, but any other configurations such as quadrangle extending laterally and circle may be adopted. Further, the position of the window opening 14*f* is not restricted to being rear of the speaker 13, but it may formed at any other angular position and height position.

Furthermore, the states of disposing the speaker systems $\mathbf{11_1}$, $\mathbf{11_2}$, and 31 with respect to the outer casing 41 are not restricted to the above described respective embodiments. For instance, the speaker system is disposed in a state where the window opening 14*f* confronts the guide plate 43*a* in the vicinity thereof. Furthermore, any other disposing states may be adopted, provided that proper folded horn parts are formed or defined.

Further, this invention is not limited to these embodiments but various variations and modifications may be made without departing from the scope and spirit of the invention.

What is claimed is:

1. A speaker system comprising: a cylindrical enclosure having a cylindrical side wall, said side wall being provided with at least one opening; at least one speaker; and means for supporting and attaching the speaker to the enclosure whereby the speaker is disposed in the enclosure through the opening and a front surface of the speaker faces outside, said supporting means comprising:

a member for supporting the speaker whereby a front portion of the speaker projects from the side wall of the enclosure through the opening, said enclosure being formed of a cardboard wound spirally in a cylindrical shape to define a paper pipe, said paper pipe being coated by a paint layer over its surface both externally and internally.

* * * * *